United States Patent
Yao et al.

(10) Patent No.: US 10,304,843 B2
(45) Date of Patent: May 28, 2019

(54) METHOD OF MANUFACTURING AND OPERATING A NON-VOLATILE MEMORY CELL

(71) Applicant: SEMICONDUCTOR COMPONENTS INDUSTRIES, LLC, Phoenix, AZ (US)

(72) Inventors: Thierry Coffi Herve Yao, Portland, OR (US); Gregory James Scott, Inkom, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 54 days.

(21) Appl. No.: 15/677,862

(22) Filed: Aug. 15, 2017

(65) Prior Publication Data

US 2017/0345833 A1    Nov. 30, 2017

Related U.S. Application Data

(62) Division of application No. 14/561,731, filed on Dec. 5, 2014, now Pat. No. 9,741,726.

(51) Int. Cl.
*H01L 27/115* (2017.01)
*H01L 27/11521* (2017.01)
*H01L 29/06* (2006.01)

(52) U.S. Cl.
CPC ...... *H01L 27/11521* (2013.01); *H01L 27/115* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 6,788,574 B1 * | 9/2004 | Han | G11C 16/0408 257/E21.694 |
| 7,586,792 B1 | 9/2009 | Bu | |
| 2006/0113627 A1 * | 6/2006 | Chen | H01L 21/76829 257/500 |
| 2006/0128097 A1 | 6/2006 | Ding | |
| 2007/0121381 A1 * | 5/2007 | Kalnitsky | G11C 16/0433 365/185.18 |
| 2011/0260232 A1 | 10/2011 | Scott et al. | |
| 2011/0316060 A1 | 12/2011 | Yao et al. | |
| 2011/0316067 A1 | 12/2011 | Yao et al. | |

(Continued)

*Primary Examiner* — Fazli Erdem
*Assistant Examiner* — Scott R Wilson
(74) *Attorney, Agent, or Firm* — Rennie William Dover

(57) ABSTRACT

A memory device includes a capacitor, a tunneling-enhanced device, and a transistor. In accordance with an embodiment, capacitor has first and second electrodes wherein the first electrode of the capacitor serves as a control gate of the memory device. The tunneling-enhanced device has a first electrode and a second electrode, wherein the first electrode of the second capacitor serves as an erase gate of the memory device and the second electrode of the tunneling-enhanced device is coupled to the second electrode of the capacitor to form a floating gate. The transistor has a control electrode and a pair of current carrying electrodes, wherein the control electrode of the transistor is directly coupled to the floating gate. In accordance with another embodiment, a method for manufacturing the memory device includes a method for manufacturing the memory device.

20 Claims, 8 Drawing Sheets

(56) References Cited

U.S. PATENT DOCUMENTS

| | | |
|---|---|---|
| 2011/0317492 A1 | 12/2011 | Yao et al. |
| 2013/0161723 A1 | 6/2013 | Yao et al. |
| 2013/0175593 A1 | 7/2013 | Yao et al. |
| 2014/0021526 A1 | 1/2014 | Yao et al. |
| 2014/0022844 A1 | 1/2014 | Yao et al. |
| 2014/0177338 A1* | 6/2014 | Ching ............... G11C 16/0441 365/185.14 |
| 2015/0069483 A1* | 3/2015 | Chen ................. H01L 27/11558 257/298 |

* cited by examiner

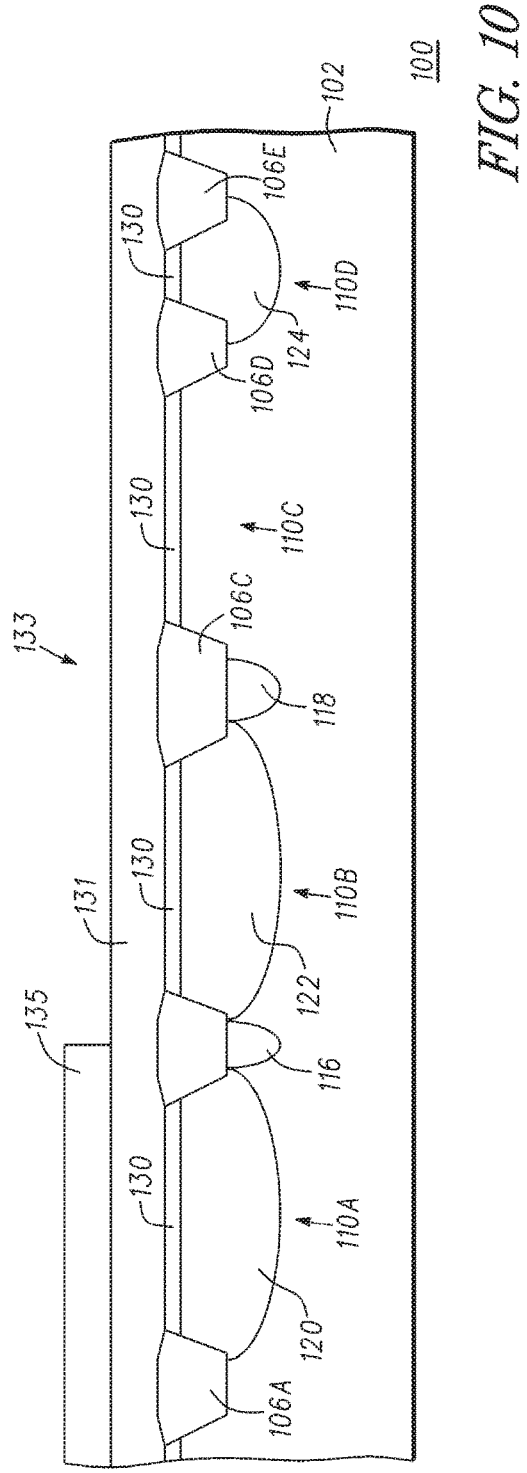
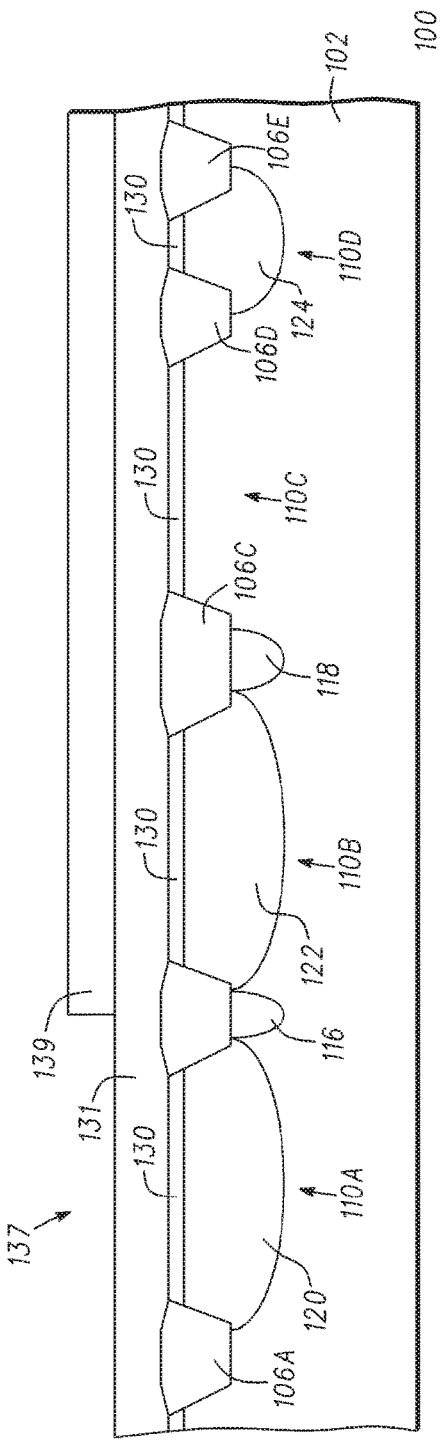

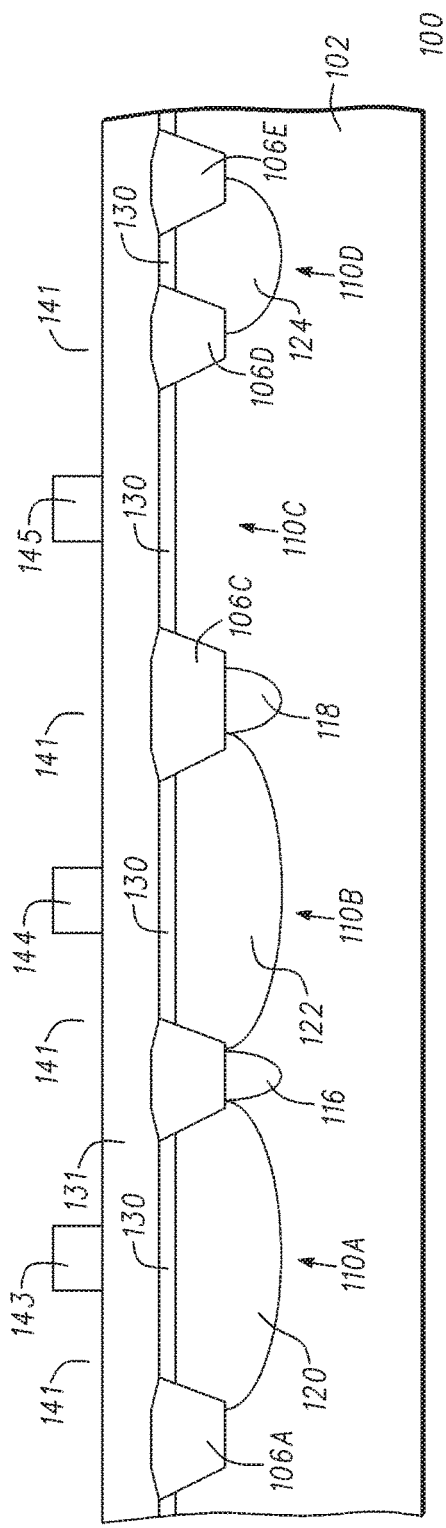
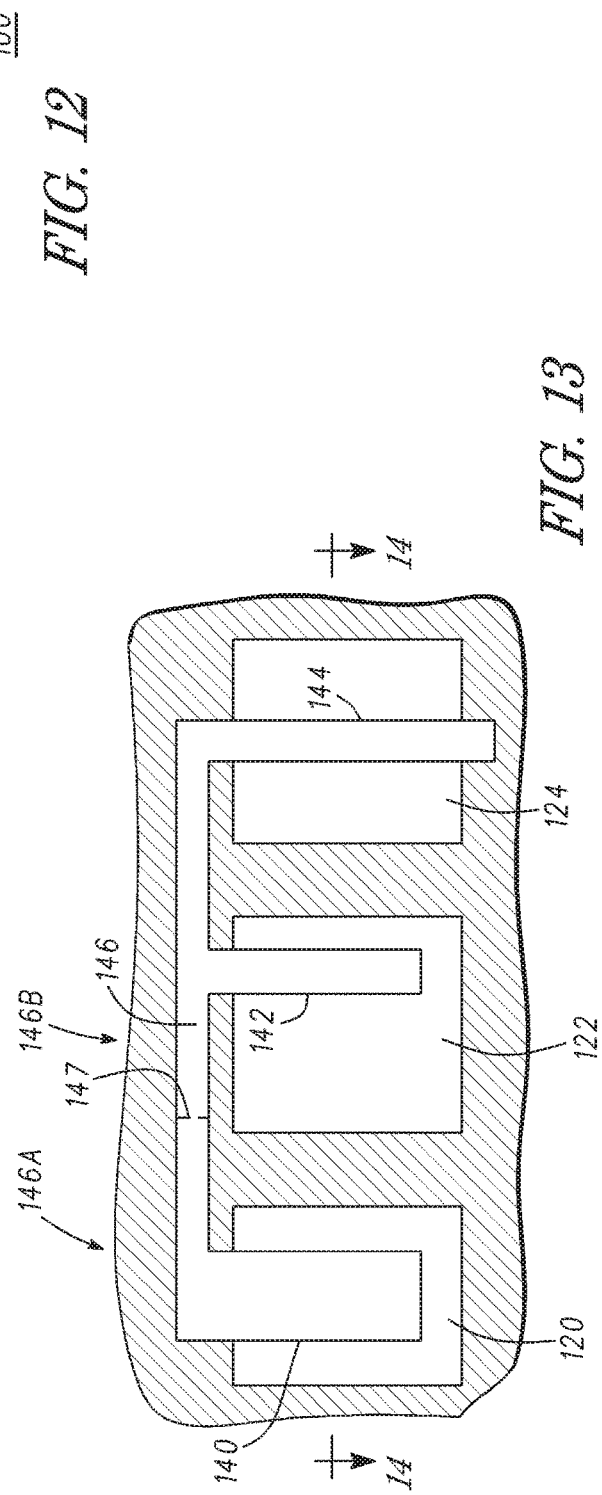

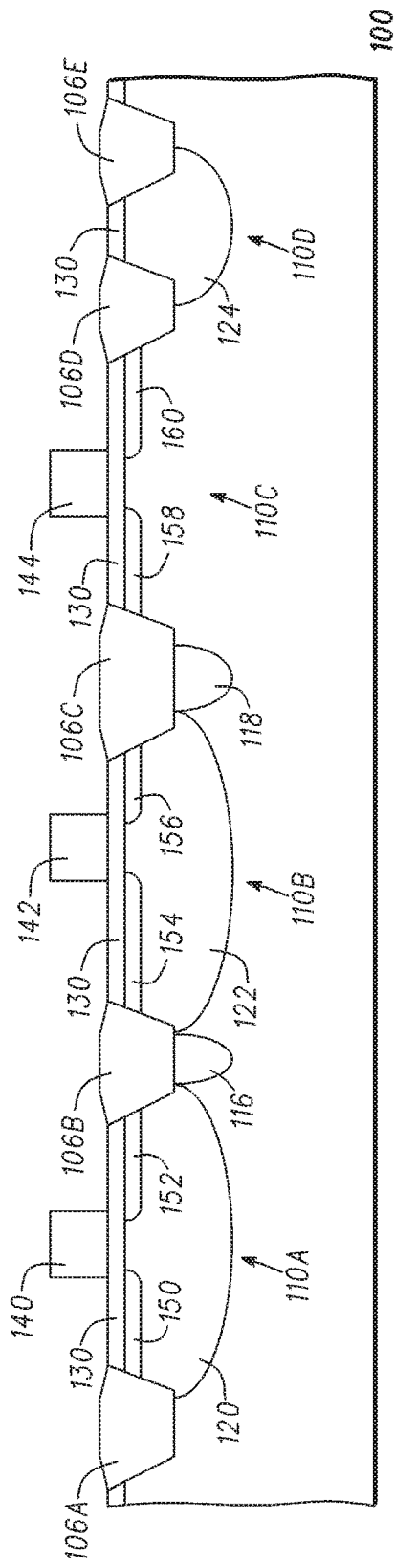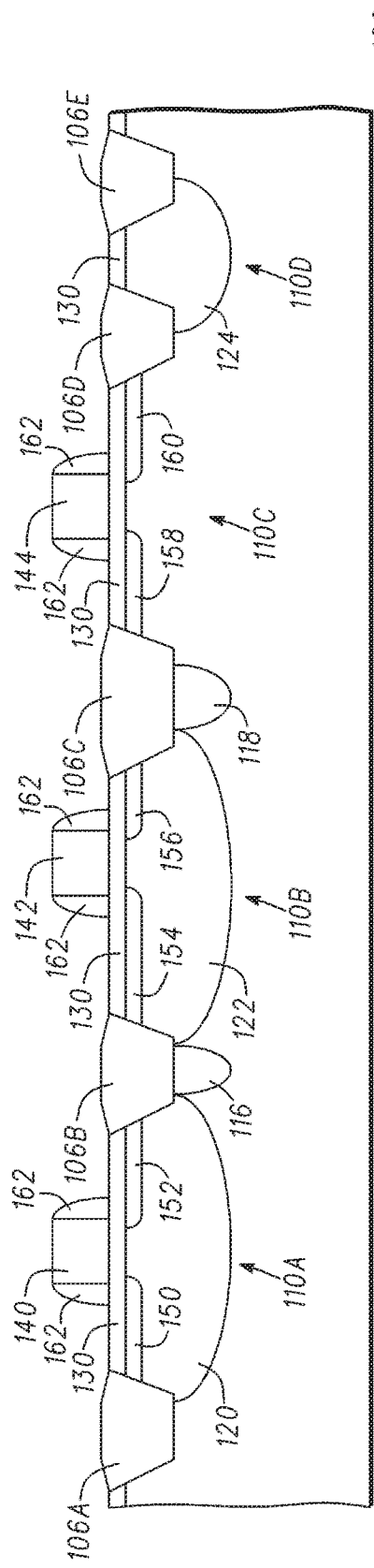

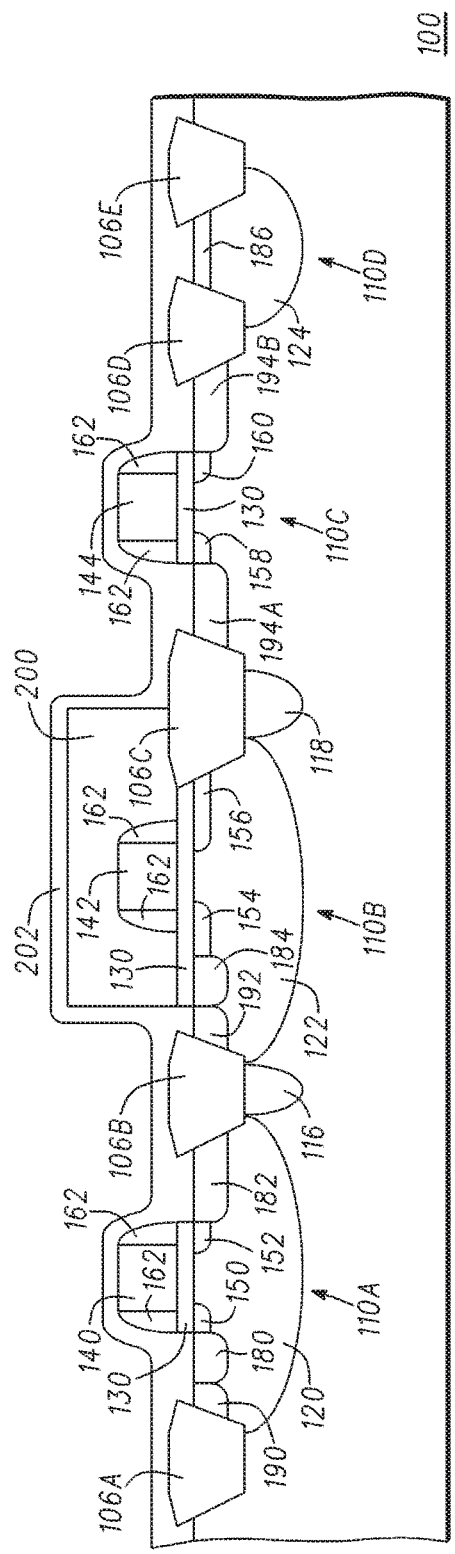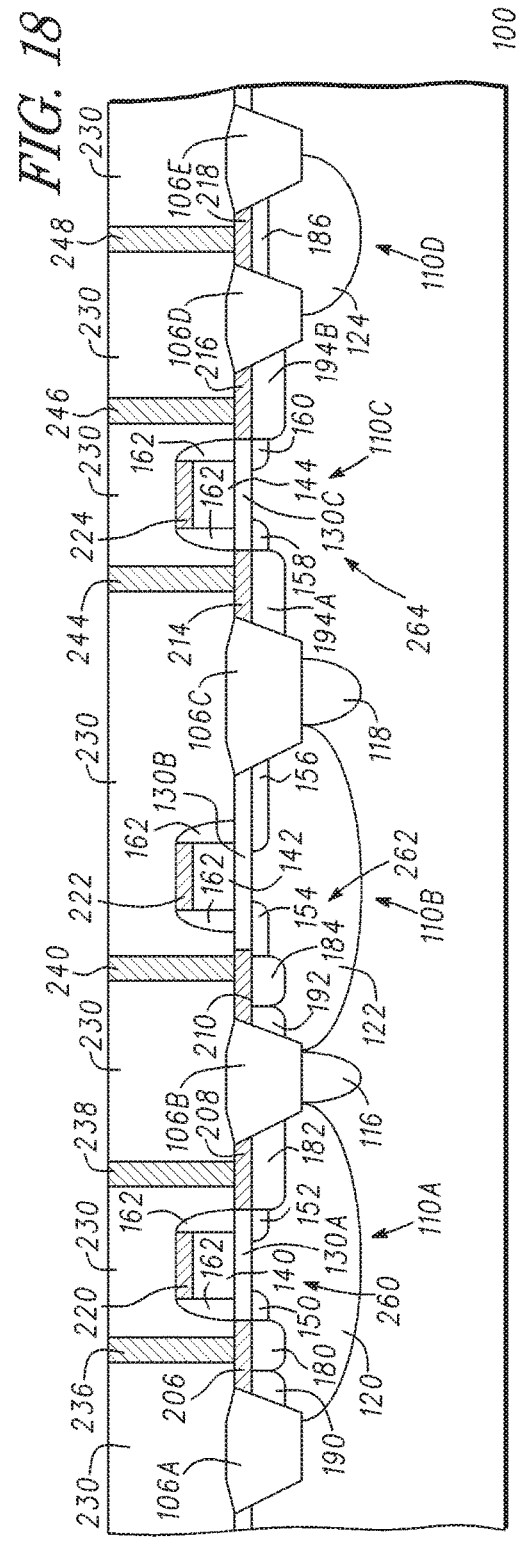

20 US 10,304,843 B2

METHOD OF MANUFACTURING AND OPERATING A NON-VOLATILE MEMORY CELL

The present application is a divisional application of U.S. patent application Ser. No. 14/561,731 filed on Dec. 5, 2014, by Thierry Coffi Herve Yao et al., titled "NON-VOLATILE MEMORY CELL AND METHOD OF MANUFACTURE" which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have fabricated integrated circuits comprising a logic block coupled to a memory block. The logic block typically included a data processing unit, such as, for example, a central processing unit, a graphical processing unit, and a memory block that stores data that can be used by the data processing unit or stored within a hard drive, a storage network, or other memory devices. In some configurations, the memory block included volatile memory, nonvolatile memory, or a combination thereof. A conventional nonvolatile memory included a charge storage layer disposed over a substrate and a control gate overlying the charge storage layer. The charge storage layer may have included a floating gate layer, a nitride layer, a layer of nanocrystals or nanoclusters, or the like. The additional layers increased the costs of manufacturing the memory blocks as well as the time to manufacture the memory blocks. In addition, using additional layers increased the complexity of the manufacturing process while reducing the yields.

Some integrated circuits have memory cells that are manufactured using a single poly process in which a single layer of polysilicon is used to manufacture the gate electrodes for nonvolatile memory cells and transistors within the logic block. In these devices, separate charge storage and control gate layers are eliminated. Memory devices have been described in U.S. Pat. No. 8,409,944 B2, titled "Process of Forming an Electronic Device Including a Nonvolatile Memory Cell having a Floating Gate Electrode or a Conductive Member with Different Portions," issued to Thierry Yao et al. on Apr. 2, 2013; U.S. Pat. No. 8,399,918 B2, titled "Electronic Device Including a Tunneling Structure," issued to Thierry Yao et al. on Mar. 19, 2013; and U.S. Pat. No. 8,279,681 B2, titled "Method of Using a Nonvolatile Memory Cell," issued to Thierry Yao et al. on Oct. 2, 2012.

Accordingly, it would be advantageous to have a memory cell and a method for manufacturing the memory cell. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 10 is a cross-sectional view of the portion of the NVM cell of FIG. 9 at a later stage of manufacture in accordance with another embodiment of the present invention;

FIG. 11 is a cross-sectional view of the portion of the NVM cell of FIG. 10 at a later stage of manufacture in accordance with another embodiment of the present invention;

FIG. 12 is a cross-sectional view of the portion of the NVM cell of FIG. 11 at a later stage of manufacture in accordance with another embodiment of the present invention;

FIG. 13 is a top view of the portion of the NVM cell of FIG. 12 at a later stage of manufacture;

FIG. 14 is a cross-sectional view of the portion of the NVM cell of FIG. 13 taken along section line 14-14 of FIG. 13 in accordance with another embodiment of the present invention;

FIG. 15 is a cross-sectional view of the portion of the NVM cell of FIG. 16 at a later stage of manufacture in accordance with another embodiment of the present invention;

FIG. 18 is a cross-sectional view of the portion of the NVM cell of FIG. 17 at a later stage of manufacture in accordance with another embodiment of the present invention; and FIG. 19 is a cross-sectional view of the portion of the NVM cell of FIG. 18 at a later stage of manufacture in accordance with another embodiment of the present invention.

For simplicity and clarity of illustration, elements in the figures are not necessarily to scale, and the same reference characters in different figures denote the same elements.

Figure 1:
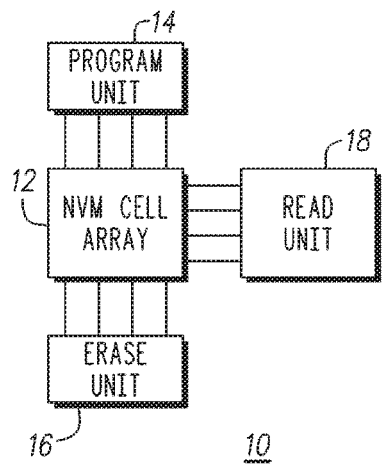
FIG. 1 is a block diagram of an semiconductor component that includes a nonvolatile memory ("NVM") cell array coupled to a program unit, an erase unit, and a read unit in accordance with an embodiment of the present invention.

Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally, the present invention provides a semiconductor component such as, for example an Electrically Erasable Programmable Read-Only Memory ("EEPROM") 100 and a method for manufacturing the semiconductor component. In accordance with an embodiment, the EEPROM comprises three active devices: a capacitor 42 having two terminals, a zero-delay self-aligned tunneling-enhanced capacitor 44 having two terminals, and a state transistor 46 having three terminals. Although state transistor 46 is shown as having three terminals, those skilled in the art will appreciate that a transistor such as, for example, transistor 46 may have a fourth terminal connected to the semiconductor material from which transistor 46 may be formed. Capacitor 42, tunneling-enhanced capacitor 44, and state transistor 46 each has a gate, wherein the gates of capacitor 42, tunneling-enhanced capacitor 44, and state transistor 46 are commonly connected together to form a node 50 which may be referred to as a floating gate. Capacitor 42 is formed from a well region 120 that forms a control gate of capacitor 42, tunneling-enhanced capacitor 44 is formed from a well region 122 that forms an erase gate of tunneling-enhanced capacitor 44, and state transistor 46 is formed from a bulk or a body of semiconductor material 102, which body of semiconductor material serves as the body of EEPROM 100. State transistor 46 has a drain that forms the drain of EEPROM 100 and a source that forms the source of EEPROM 100. The bulk semiconductor material of state transistor 46 serves as the body of EEPROM 100, the drain of state transistor 46 serves as the drain of EEPROM 100, and the body of PMOS capacitor 42 serves as the control gate of the EEPROM 100. EEPROM 100 may also be referred to as a semiconductor component or an EEPROM device.

In accordance with another embodiment, a method of manufacturing a non-volatile memory cell is provided comprising providing a semiconductor material of a first conductivity type having a major surface. A first isolation region is formed in a first portion of the semiconductor material and a second isolation region is formed in a second portion of the semiconductor material, wherein the first isolation region has first and second sides and the second isolation region has first and second sides. The portion of the semiconductor material adjacent the first side of the first isolation region serves as a first active area, the portion of the semiconductor material between the second side of the first isolation region and the first side of the second isolation region serves as a second active area, and the portion of the semiconductor material adjacent the second side of the second isolation region serving as a third active area. A first capacitor is formed from the first active area, wherein the first capacitor has first and second electrodes, the first electrode of the first capacitor serves as a control gate. A tunneling-enhanced device is formed from the second active area, wherein the tunneling-enhanced device has a first electrode that serves as an erase gate and a second electrode coupled to the second electrode of the first capacitor to form a floating gate. A state transistor is formed from the third active area, wherein the state transistor has a control electrode directly coupled to the floating gate, a first current carrying electrode, and a second current carrying electrode.

FIG. 1 is a block diagram of an integrated circuit 10 that includes a nonvolatile memory ("NVM") cell array 12 coupled to a program unit 14, an erase unit 16, and a read unit 18 in accordance with an embodiment of the present invention. Program unit 14, erase unit 16, and read unit 18 are configured to provide voltages to NVN cell array 12 for programming, erasing, and reading memory cells within NVM cell array 12. Although program unit 14, erase unit 16, and read unit 18 are shown as separate units, operations within a unit can be combined with or performed by one of the other units. For example, a single charge pump may be used for programming and erasing or the same voltage divider may be used for programming and reading.

Figure 2:
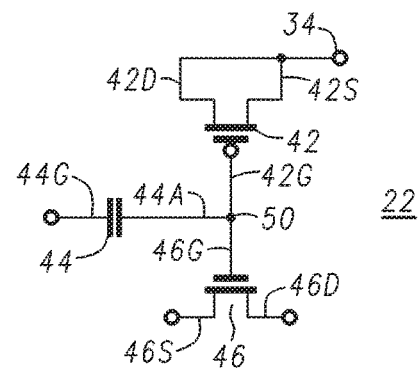
FIG. 2 is a circuit schematic of a single NVM cell of the NVM cell array of FIG. 1.

FIG. 2 is circuit schematic of a single NVM cell within NVM cell array 12 of FIG. 1. Each cell within NVM cell array 12 is comprised of a plurality of NVM memory cells 22, wherein each memory cell comprises a capacitor 42, a tunneling-enhanced device 44, and a state transistor 46. The bulk of the semiconductor material or the body of semiconductor material from which active devices 42, 44, and 46 are manufactured is connected to or tied to a ground potential, e.g., a source of operating potential $V_{SS}$ is ground. Operating potential $V_{SS}$ is not limited to being a ground potential and may be another potential. In accordance with an embodiment, capacitor 42 comprises a field effect transistor having a control electrode 42G and current carrying electrodes 42D and 42S, wherein current carrying electrodes 42D and 42S are commonly connected together to form a control gate 34 of NVM cell 22. Tunneling-enhanced device 44 may be a tunneling-enhance MOS structure or a tunneling-enhanced capacitor 44 and comprises a control electrode 44G and an active electrode 44A, wherein active electrode 44A may be formed from the current conducting electrodes of tunneling-enhanced capacitor 44. Control gate 44G serves as an erase gate of NVM cell 22. State transistor 46 comprises a control electrode 46G, a current carrying electrode 46D, and a current carrying electrode 46S. Current carrying electrode 46D serves as the drain electrode of NVM cell 22 and current carrying electrode 46S serves as a source electrode of NVM cell 22. Active electrode 44A, control gate 42G, and control gate 46 are commonly connected together to form a node 50.

Figure 3:
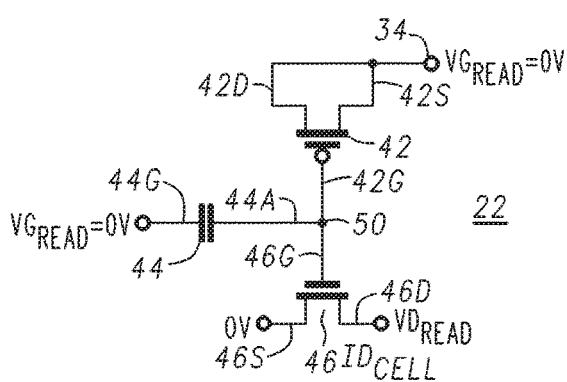
FIG. 3 is a circuit schematic of the single NVM cell of FIG. 2 configured for performing a read operation in accordance with an embodiment of the present invention.

Referring now to FIG. 3, NVM cell 22 is configured for performing a read operation. What is shown in FIG. 3 is source electrode 46S of NVM cell 22 coupled for receiving a ground potential (0 volts) and the drain electrode 46D of NVM cell 22 biased to a read voltage $VD_{READ}$, e.g., 0.5 volts, to generate or sink a cell current $ID_{CELL}$, wherein cell current $ID_{CELL}$ flows from drain electrode 46D to source electrode 46S. It should be noted that cell current $ID_{CELL}$, is a function of the voltage $VG_{READ}$ at control gate 34 of capacitor 42 and erase gate 44G of tunneling-enhanced capacitor 44 because floating gate node 50, which is also the gate of state transistor 46, is capacitively coupled to control gate 34 of capacitor 42 and erase gate 44G of tunneling-enhanced capacitor 44. It should be further noted that cell current $ID_{CELL}$ is also dependent on the charge stored in floating gate node 50 for a given voltage at gates 34 and 44G, i.e., a positive charge on floating gate 50 adds a positive voltage bias to the floating gate 50 and a negative charge on floating gate 50 adds a negative voltage bias to the floating gate 50.

Figure 4:
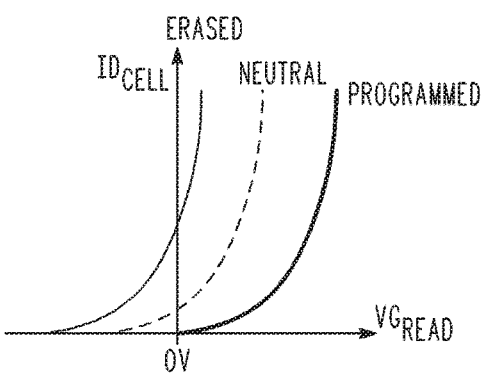
FIG. 4 is a plot of current versus voltage for a transistor of the NVM cell of FIG. 1.

Briefly referring to FIG. 4, a plot 23 of cell current $ID_{CELL}$ versus read voltage $VG_{READ}$ is illustrated for an erased state, a programmed state, and a neutral state, assuming that the erased state is the one where the charge on floating gate 50 is positive, the programmed state is the one where the charge on floating gate 50 is negative, and the neutral state is the one where the charge on the floating gate is neutral or zero. Therefore, assuming control gate 34 of capacitor 42 and erase gate 44G of tunneling-enhanced device 44 are biased at a voltage $VG_{READ}$, e.g., 1.2 volts, an erased cell supplies more current $ID_{CELL}$ than a programmed cell.

In an embodiment in which state transistor 46 is a depletion device, read voltage $VG_{READ}$ at erase gate 44G can be set to a supply voltage $V_{SS}$. It should be noted that with read voltage $VG_{READ}$ substantially equal to zero volts, EEPROM 100 is in a neutral state and still generates a current to be read, which allows operating EEPROM 100 in a lower stress configuration thereby improving device reliability.

Figure 5:
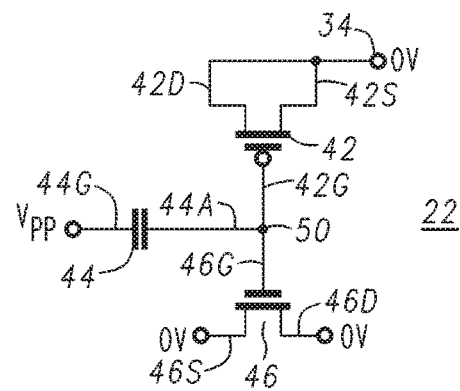
FIG. 5 is a circuit schematic of the single NVM cell of FIG. 2 configured for performing an erase operation in accordance with an embodiment of the present invention.

Referring now to FIG. 5, NVM cell 22 is configured for performing an erase operation. What is shown in FIG. 5 is control gate 34, source electrode 46S, and drain electrode 46D of NVM cell 22 coupled for receiving a ground potential (0 volts) and erase gate 44G coupled for receiving, for example, a voltage $V_{PP}$. It should be noted that voltage $V_{PP}$ may be an external voltage or an internal programming voltage $V_{PP}$. In this biasing configuration, the voltage at floating gate 50 remains low due to its high coupling with control gate 34. There is a large N-well-to-gate voltage drop which causes electrons to tunnel from floating gate node 50 to the N-well causing floating gate node 50 to accumulate positive charge. In accordance with an embodiment, the N-well is N-well 122 shown in FIGS. 9-12 and 14-19.

Figure 6:
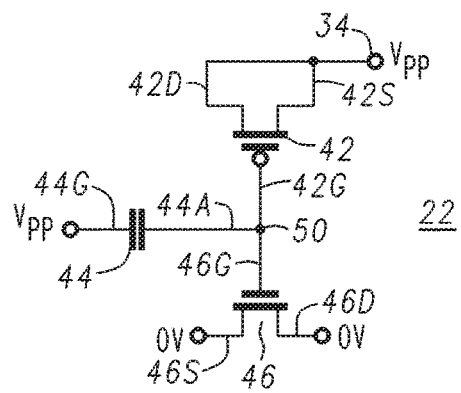
FIG. 6 is a circuit schematic of the single NVM cell of FIG. 2 configured for performing a programming operation in accordance with an embodiment of the present invention.

Referring now to FIG. 6, NVM cell 22 is configured for performing a programming operation. What is shown in FIG. 6 is control gate 34 and erase gate 44G of NVM cell 22 coupled for receiving voltage $V_{PP}$ while the source electrode 46S and drain electrode 46D of NVM cell 22 are coupled for receiving ground potential (0 volts). In this biasing configuration, the voltage at floating gate 50 is set to voltage $V_{PP}$ because of coupling to control gate 34 and to erase gate 44G. There is a high gate-to-source and bulk voltage drop for state transistor 46 which forms an electron channel under the gate allowing electrons to tunnel from that channel to floating gate node 50. Thus, negative charge accumulates at floating gate node 50 while programming.

Figure 7:
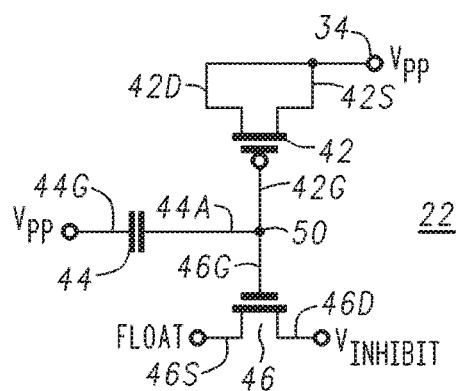
FIG. 7 is a circuit schematic of the single NVM cell of FIG. 2 configured for inhibiting a programming operation in accordance with an embodiment of the present invention.

Referring now to FIG. 7, NVM cell 22 is configured for inhibiting a programming operation, which allows, among other things, selective programming. What is shown in FIG. 7 is control gate 34 and erase gate 44G of NVM cell 22 coupled for receiving a voltage $V_{PP}$ while source electrode 46S is left floating and drain electrode 46D of NVM cell 22 are coupled for receiving a programming inhibit signal $V_{INHIBIT}$. In this biasing configuration, the voltage at the channel of state transistor 46 is $V_{INHIBIT}$. Therefore, the floating gate-to-channel voltage drop is reduced which inhibits channel electrons from tunneling to floating gate 50.

It should be noted that NVM cell 22 can perform at least a read operation, a programming operation, or an erase operation. During a read operation, voltage $VD_{READ}$ is the voltage applied to the drain of the memory cell that is being read. By way of example, voltage $V_{DD}$ ranges from about 0.9 volts to about 5 volts, voltage $VG_{READ}$ can be in a range of approximately 0 volts to approximately $V_{DD}$; the erase pulse, the program pulses, internal programming voltage $V_{PP}$ can be in a range of approximately 8 volts to approximately 25 volts; and voltage $V_{INHIBIT}$ can be in a range of approximately 1.8 volts to approximately $(½)*V_{PP}$.

Figure 8:
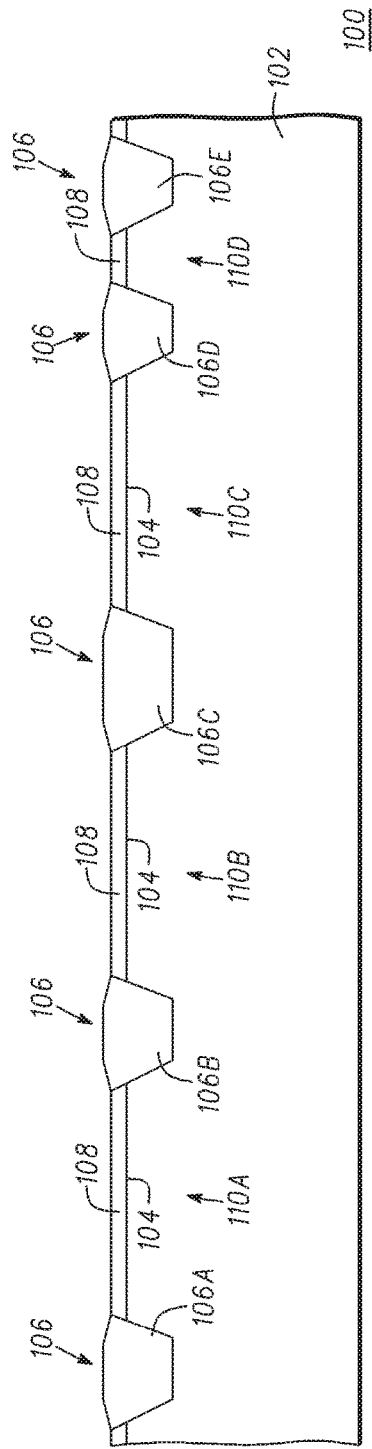
FIG. 8 is a cross-sectional view of a portion of an NVM cell at an early stage of manufacture in accordance with another embodiment of the present invention.

FIG. 8 is a cross-sectional view of a semiconductor component 100 that includes an NVM cell 22 during an early stage of manufacture in accordance with an embodiment of the present invention. What is shown in FIG. 8 is a semiconductor material 102 having a major surface 104. Semiconductor material 102 may be a monocrystalline semiconductor material, a semiconductor-on-insulator substrate, a silicon layer over a glass plate, an epitaxially grown layer on a semiconductor substrate, a semiconductor material comprising a Group 14 element, e.g., carbon, silicon, germanium, or combinations thereof, or another semiconductor material conventionally used in the manufacture of semiconductor components. In accordance with an embodiment, semiconductor material 102 is lightly doped with an impurity material of p-type conductivity, i.e., a p-type dopant. Alternatively, semiconductor material 102 may be doped with an impurity material of n-type conductivity.

A layer of electrically insulating material 108 is formed on or from semiconductor material 102 and field isolation regions 106A-106E are formed within portions of semiconductor material 102. Field isolation regions 106A-106E may be collectively referred to as field isolation regions 106 and extend from surface 104 into semiconductor material 102, wherein each of field isolation regions 106A-106E has first and second sides. It should be noted that field isolation regions 106 may extend above surface 104. Layer of electrically insulating material 108 may be referred to as an electrically insulating layer, an insulating layer, or a dielectric layer. Insulating layer 108 may include a pad layer and a stopping layer such as, for example, a polish-stop layer or an etch-stop layer, that are sequentially formed on or from semiconductor material 102 using a thermal growth technique, a deposition technique, a combination of a thermal growth technique and a deposition technique or the like. The pad layer may be the same material as the stopping layer or it may be a different material than the stopping layer. In accordance with an embodiment, the pad layer is oxide and the stopping layer is nitride. Field isolation regions 106A, 106B, 106C, 106D, and 106E are formed in separate portions of semiconductor material 102 and may be formed using a shallow trench isolation technique, a local-oxidation-of-silicon technique, a deep trench isolation technique, or the like. Field isolation regions 106A and 106B define an active area 110A, field isolation regions 106B and 106C define an active area 110B, field isolation regions 106C and 106D define an active area 110C, and field isolation regions 106D and 106E define an active area 110D, and may be formed using a shallow trench isolation technique, a local-oxidation-of-silicon technique, or the like.

Figure 9:
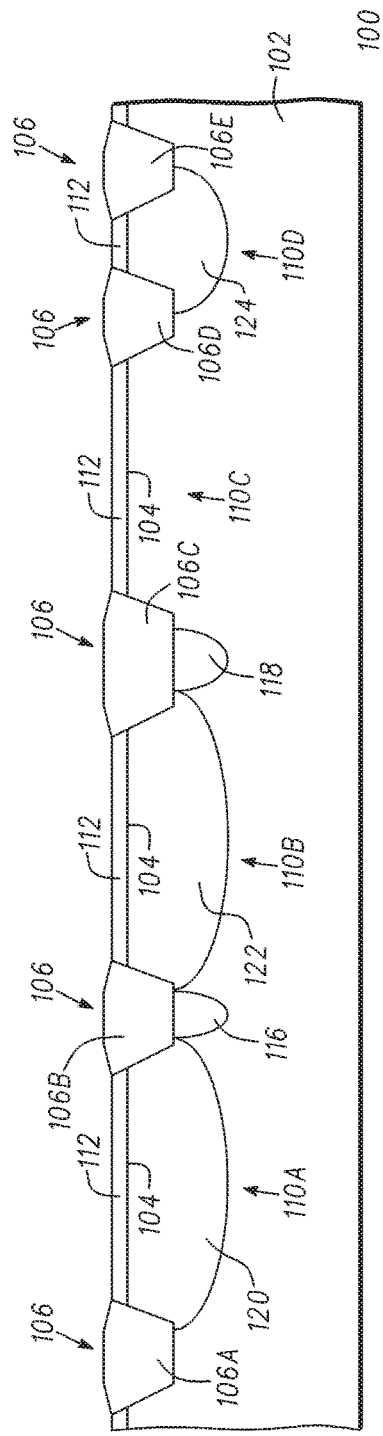
FIG. 9 is a cross-sectional view of the portion of the NVM cell of FIG. 8 at a later stage of manufacture in accordance with another embodiment of the present invention.

Referring now to FIG. 9, insulating layer 108 is removed and an implant screen layer 112 having a thickness ranging from about 5 Angstroms (Å) to about 1,000 Å is formed on or from semiconductor material 102. The thickness of implant screen layer 112 is not a limitation of the present invention. Implant screen layer 112 is a sacrificial layer. A layer of photoresist (not shown) may be patterned over semiconductor material 102 to have openings that expose the portions of implant screen layer 112 that are over active areas 110A and 110B. The patterned layer of photoresist may be referred to as an N-well mask. Doped regions 120 and 122 are formed in semiconductor material 102 extending from surface 104 into semiconductor material 102. Doped regions 120 and 122 may be referred to as well regions or wells. In accordance with an embodiment, well regions 120 and 122 are formed by doping active areas 110A and 110B with an impurity material of n-type conductivity using for example, ion implantation. Thus, doped region 120 is formed from active area 110A and doped region 122 is formed from active area 110B. By way of example, well regions 120 and 122 are formed by implanting an n-type dopant such into semiconductor material 102 at a dose ranging from about $1\times10^{10}$ ions per centimeter squared ("ions/cm$^2$") to about $1\times10^{14}$ ions/cm$^2$ and an implant energy ranging from about 5 kilo-electron volts ("keV") to about 10,000 keV. Wells 120 and 122 may be referred to as being n-wells. Suitable n-type dopants or impurity materials include phosphorus, arsenic, antimony, or the like. The implant energy and dose for forming well regions 120 and 122 are not limitations of the present invention. The semiconductor material is annealed to drive in the n-type impurity material to form n-wells 120 and 122 and to repair any implant damage that may have occurred.

The layer of photoresist is removed and another layer of photoresist (not shown) may be patterned over semiconductor material 102 to have an opening that exposes the portion of implant screen layer 112 over active area 110D. The patterned layer of photoresist may be referred to as a p-well mask or a not n-well mask. A doped region 124 is formed in semiconductor material 102 and extends from surface 104 into semiconductor material 102. Doped region 124 may be referred to as a well region or a p-well. In accordance with an embodiment well region 124 is formed by doping active area 110D with an impurity material of p-type conductivity using for example, ion implantation. By way of example, well region 124 is formed by implanting a p-type dopant or a p-type impurity material into active area 110D at a dose ranging from about $1\times10^{10}$ ions/cm$^2$ to about $1\times10^{14}$ ions/cm$^2$ and an implant energy ranging from about 10 keV to about 10,000 keV. Suitable p-type dopants or p-type impurity materials include boron, indium, or the like. The implant energy and dose for forming well region 124 are not limitations of the present invention.

Still referring to FIG. 9, the layer of photoresist is removed and another layer of photoresist (not shown) may be patterned over semiconductor material 102 to have openings that expose portions of field oxide regions 106B and 106C. Doped regions 116 and 118 are formed in semiconductor material 102 and extend from the bottom surfaces of field isolation regions 106B and 106C, respectively, into semiconductor material 102. Doped regions 116 and 118 may be referred to as channel stop regions. In accordance with an embodiment channel stop region 116 may be formed by doping the portion of semiconductor material 102 below field isolation region 106B and between active areas 110A and 110B with an impurity material of p-type conductivity using, for example, ion implantation. Channel stop region 118 may be formed by doping the portion of semiconductor material 102 below field isolation region 106C and between active areas 110B and 110C with an impurity material of p-type conductivity using, for example, ion implantation. By way of example, well regions 116 and 118 are formed by implanting a p-type dopant into semiconductor material 102 at a dose ranging from about $1\times10^{10}$ ions/cm$^2$ to about $1\times10^{14}$ ions/cm$^2$ and an implant energy ranging from about 5 keV to about 1,000 keV. Well 124 may be referred to as being a p-well. The patterned layer of photoresist is removed and the semiconductor material may be annealed. As those skilled in the art are aware, boron is a smaller atom that easily inserts itself in the silicon lattice. Thus, boron implants cause less damage to the silicon lattice and therefore an anneal step may be an optional step.

N-well regions 120 and 122 are lightly doped and have dopant concentrations that are higher than the dopant concentration of semiconductor material 102. Field isolation region 106B in combination with doped region 116 electrically isolate active areas 110A and 110B from each other, and field isolation region 106C in combination with doped region 118 electrically isolate active area 110B from active area 110C. N-well regions 120 and 122 may have the same dopant concentration or they may have different dopant concentrations.

It should be noted that n-well regions 120 and 122 may be formed during the same doping operation or during different doping operations and that well regions 116, 118, and 124 may be formed during the same doping operation or during different doping operations. Alternatively, any or all of well regions 116, 118, 120, 122, and 124 may be formed before the formation of field isolation regions 106. In accordance with another alternative embodiment, well regions 116 and 118 may be formed before the formation of field isolation regions 106A-106E, and well regions 120, 122, and 124 may be formed after the formation of field isolation regions 106A-106E.

In accordance with another embodiment, one or more of well regions 116, 118, 120, 122, and 124 may be omitted.

Referring now to FIG. 10, insulating layer 112 is removed and a layer of electrically insulating material 130 having a thickness ranging from about 5 nanometers ("nm") to about 20 nm is formed on or from active areas 110A, 110B, 110C, and 110D of semiconductor material 102. Electrically insulating material 130 may have a thickness ranging from about 60 Å to about 150 Å. By way of example, electrically insulating layer 130 may be oxide, nitride oxide, or hafnium oxide that may be formed using a thermal growth technique, a deposition technique, or a combination thereof. Electrically insulating layer 130 serves as a gate dielectric material. In embodiments in which electrically insulating layer 130 is oxide, layer 130 may be referred to as a gate oxide layer or a tunnel oxide of the tunneling-enhanced capacitor 44. Alternatively, electrically insulating layer 130 may be formed using a dual-oxide approach by forming insulating layer 130 as a two layer stack or using a triple-oxide approach by forming a triple layer stack using a grow-etch-grow process. By way of example, the first layer may have a thickness of about 3 nm and the second layer may have a thickness of about 7 nm in a two layer stack, whereas the first layer may have a thickness of about 3 nm, the second layer may have a thickness of about 7 nm, and the third layer may have a thickness of about 9 nm in a triple layer stack.

Still referring to FIG. 10, a layer of material 131 having a thickness ranging from about 50 nm to about 300 nm is formed on insulating layer 130. In accordance with an embodiment, the layer of material is polysilicon doped with an impurity material to make it electrically conductive. Alternatively, layer of material 131 may be an amorphous semiconductor material doped with an impurity material, a metal, or the like. In an embodiment in which layer of material 131 is polysilicon, a portion of the polysilicon layer is doped with an impurity material of p-type conductivity to form a heavily doped p-region, i.e., a p-type heavily doped portion, and a different portion of the polysilicon layer is doped with an impurity material of n-type conductivity to form a heavily doped n-region, i.e., an n-type heavily doped portion. Thus, a layer of photoresist is formed on layer of polysilicon 131 and patterned to have an opening 133 that exposes a portion of polysilicon layer 131 and a masking element 135 that protects a portion of layer of polysilicon 131. An impurity material of n-type conductivity is implanted into the exposed portion of polysilicon layer 131 at a dose ranging from about $1 \times 10^{15}$ ions/cm$^2$ to about $1 \times 10^{16}$ ions/cm$^2$ and an implant energy of ranging from about 25 keV to about 100 keV. By way of example, the impurity material is phosphorus, the implant dose is $1 \times 10^{15}$ ions/cm$^2$, and the implant energy is 50 keV.

Referring now to FIG. 11, masking element 135 is removed and a layer of photoresist is formed on layer of polysilicon 131 and patterned to have an opening 137 that exposes a portion of polysilicon layer 131 and a masking element 139 that protects a portion of polysilicon layer 131. An impurity material of p-type conductivity is implanted into the exposed portion of polysilicon layer 131 at a dose ranging from about $1 \times 10^{15}$ ions/cm$^2$ to about $1 \times 10^{16}$ ions/cm$^2$ and an implant energy ranging from about 25 keV to about 100 keV. By way of example, the impurity material is boron, the implant dose is $1 \times 10^{15}$ ions/cm$^2$, and the implant energy is 50 keV. Masking element 139 is removed.

Referring now to FIG. 12, a layer of photoresist is formed on layer of polysilicon 131 and patterned to have an openings 141 that expose portions of polysilicon layer 131 and masking elements 143, 144, and 145 that protect portions of polysilicon layer 131, wherein the portions of polysilicon layer 131 that are exposed by openings 141 are above field isolation regions 106A, 106B, 106C, 106D, and 106E and the portions of polysilicon layer 131 that are laterally adjacent to field isolation regions 106A, 106B, 106C, 106D, and 106E.

FIG. 13 is a top view of semiconductor component 100 at a later stage of manufacture and FIG. 14 is a cross-sectional view of semiconductor component 100 taken along section line 14-14 of FIG. 13. FIGS. 13 and 14 are described together. The exposed portions of polysilicon layer 131 are removed using, for example, an anisotropic etch to form a gate conductor 140 of capacitor 42, a gate conductor 142 of tunneling-enhanced device 44, and a gate conductor 144 of state transistor 46. Gate conductors 140, 142, and 144 are electrically coupled together by a conductive member 146, which serves as floating gate 50 (shown in FIG. 2) for NVM cell 22, where portions 146A and 146B of conductive member 146 have opposite conductivity types. The interface between portions 146A and 146B is shown by broken line 147. In an embodiment, portion 146A is p-type conductivity and portion 146B is n-type conductivity. The part of conductive member 146 that is disposed over well region 120 is an upper electrode 140 for capacitor 42, the part of electrically conductive member 146 that is disposed over well region 122 is an upper electrode 142 for tunneling-enhanced capacitor 44, and the part of conductive member 146 that is disposed over active area 110C is a gate electrode 144 for state transistor 46. It should be noted that a subsequently formed metal containing layer will be formed over portions 146A and 146B so that the portions are electrically connected to each other to form a floating gate electrode for the memory cell.

Still referring to FIG. 14, a layer of insulating material (not shown) having a thickness of about 20 nm or less may be formed by thermally oxidizing conductive member 146 including upper electrodes 140 and 142 and gate electrode 144. A patterned masking layer (not shown) is formed that includes a masking member over well region 124 and openings over well regions 120 and 118. An impurity material of p-type conductivity, such as, for example, boron or boron difluoride, is implanted through the openings of the patterned masking layer to form doped regions 150 and 152 in well region 120 and doped regions 154 and 156 in well region 122. Doped regions 150, 152, 154, and 156 may be referred to as lightly doped regions, p-type lightly doped regions, or pLLDs. The patterned masking layer is removed and another patterned masking layer (not shown) is formed that includes a masking member over well regions 120 and 122 and an opening over active area 110C. An impurity material of n-type conductivity, such as, for example, phosphorus, is implanted through the opening of the pattern masking layer to form doped regions 158 and 160 in active area 110C. Doped regions 158 and 160 may be referred to as lightly doped regions, n-type lightly doped regions, or nLLDs. Thus, n-type lightly doped regions are not formed in n-wells 120 and 122. By way of example, doped regions 150, 152, 154, 156, 158, and 160 have a dopant concentration of less than about $1 \times 10^{19}$ atoms per centimeter cubed (atoms/cm$^3$). In accordance with an embodiment, doped regions 150, 152, 154, 156, 158, and 160 have dopant concentrations that are greater than the dopant concentrations of well regions 120, 122, and 124. It should be noted that the order of forming the patterned masking layers and doped regions 150-160 is not a limitation of the present invention.

Referring now to FIG. 15, an insulating layer having a thickness ranging from about 20 nm to about 500 nm is conformally deposited on insulating layer 130, electrodes 140, 142, and 144, and field isolation regions 106A-106D and anisotropically etched to form insulating spacers 162 along the sidewalls of electrodes 140, 142, and 144.

Figure 16:
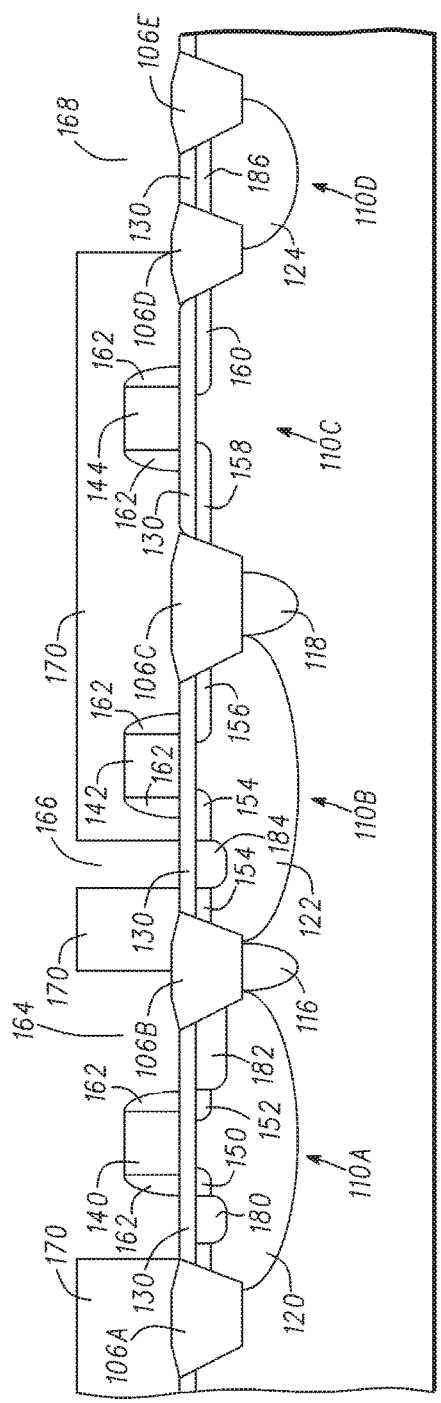
FIG. 16 is a cross-sectional view of the portion of the NVM cell of FIG. 15 at a later stage of manufacture in accordance with another embodiment of the present invention.

Referring now to FIG. 16, a layer of photoresist is formed over field isolation regions 106A-106E, the exposed portions of insulating layer 130, gates 140, 142, and 144, and spacers 162 and patterned to have openings 164, 166, and 168, and masking elements 170. Opening 164 exposes upper electrode 140, spacers 162 adjacent upper electrode 140, portions of insulating layer 130 laterally positioned between the spacer 162 that is above doped region 150 and field isolation region 106A. Opening 166 exposes a portion of insulating layer 130 that is between upper electrode 142 and field isolation region 106B. Opening 168 exposes the portion of insulating layer 130 between field isolation regions 106D and 106E. An impurity material of p-type conductivity, such as for example, boron, is implanted through openings 164, 166, and 168 to form doped regions 180 and 182 in well region 120, doped region 184 in well region 122, and doped region 186 in well region 124. Typically, the implant is at a high dose (approximately $1 \times 10^{15}$ ions/cm$^2$) and a low energy (less than about 10 keV). Masking elements 170 are removed. It should be noted that the implant forming doped regions 180 and 184 compensates the impurity material of doped regions 150 and 152, respectively.

Figure 17:
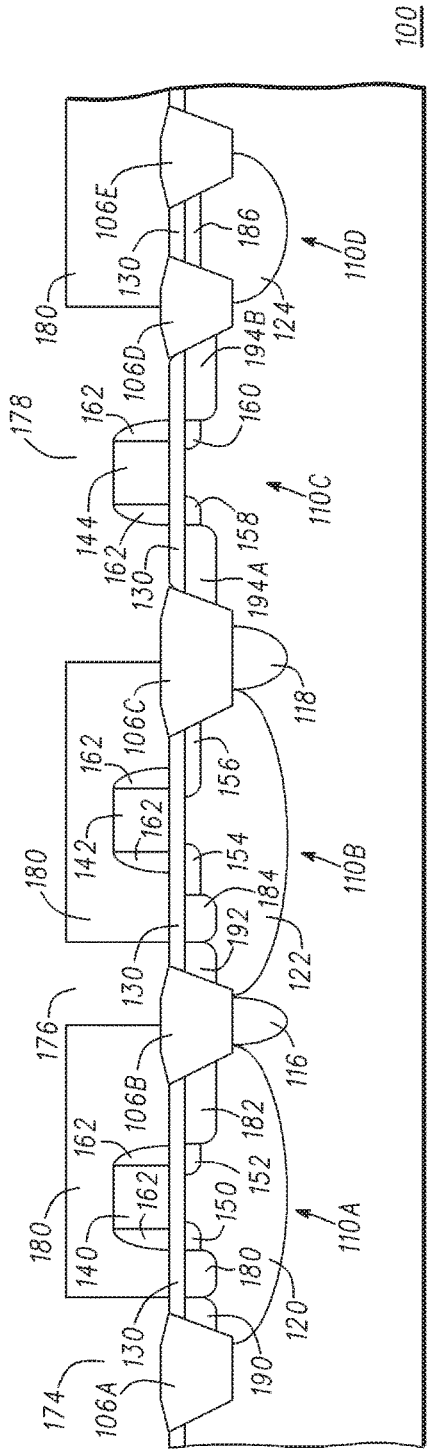
FIG. 17 is a cross-sectional view of the portion of the NVM cell of FIG. 16 at a later stage of manufacture in accordance with another embodiment of the present invention.

Referring now to FIG. 17, a layer of photoresist is formed over field isolation regions 106A-106E, the exposed portions of insulating layer 130, gates 140, 142, and 144, and spacers 162 and patterned to have openings 174, 176, and 178, and masking elements 180. Opening 174 exposes a portion of insulating layer 130 adjacent to field isolation region 106A. Opening 176 exposes a portion of insulating layer 130 adjacent to field isolation region 106B. Opening 178 exposes gate electrode 144, spacers 162 adjacent gate electrode 144, a portion of insulating layer 130 laterally positioned between the spacer 162 that is above doped region 158, and the portion of insulating layer 130 that is between gate electrode 144 and field isolation region 106C and a portion of insulating layer 130 laterally positioned between the spacer 162 that is above doped region 160 and field isolation region 106D. An impurity material of n-type conductivity, such as for example, arsenic, is implanted through openings 174, 176, and 178 at a high dose, e.g., approximately $1 \times 10^{15}$ ions/cm$^2$, and a low energy, e.g., less than about 10 keV, to form doped region 190 in well region 120, doped region 192 in well region 122, and doped regions 194A and 194B in active area 110C. It should be noted that the implant forming doped regions 190 and 192 compensates the impurity material of doped regions 150 and 154, respectively.

Referring now to FIG. 18, masking elements 180 are removed and a silicide blocking layer (not shown) having a thickness ranging from about 1 nm to about 30 nm is formed over field isolation regions 106A-106E, electrodes 140, 142, and 144, spacers 162, and doped regions 154, 156, 158, 160, 180, 182, 184, 186, and 190. Suitable materials for the silicide blocking layer include nitride, oxide, oxynitride, an undensified deposited material having a relatively high concentration of dopant or impurity materials or the like. In accordance with an embodiment, the composition of the silicide blocking layer is selected to have a different etch selectivity than the material of field isolation regions 106A-106E. For example, the composition of field isolation regions 106A-106E may be oxide and the composition of the silicide blocking layer may be oxynitride or nitride.

A layer of photoresist (not shown) is formed over the silicide blocking layer and patterned to form a blocking mask 200 over upper electrode 142, the spacers 162 that are adjacent to the sidewalls of upper electrode 142, a portion of field isolation region 106C, a portion of surface 104 over active area 110B, and a portion of doped region 184. The exposed portions of insulating layer 130 are removed using, for example, a wet etch. By way of example, the etchant for the wet etch is hydrofluoric acid. It should be noted that the etch is not limited to being a wet etch. Removing the exposed portions of insulating layer 130 exposes doped regions 180, 182, 184, 186, and 190, 192, 194A, and 194B. A layer of refractory metal 202 is conformally deposited over the exposed portions of doped regions 180, 182, 184, 186, and 190, 192, 194A, and 194B and over field isolation regions 106A-106E and blocking mask 200. By way of example, the refractory metal is nickel, having a thickness ranging from about 50 Å to about 150 Å.

Referring now to FIG. 19, the refractory metal is heated to a temperature ranging from about 350 degrees Celsius ("° C.") to about 500° C. The heat treatment causes the nickel to react with the silicon to form nickel silicide (NiSi) in all regions in which the nickel is in contact with silicon. Thus, a nickel silicide layer 206 is formed from doped regions 180 and 190, a nickel silicide layer 208 is formed from doped region 182, a nickel silicide layer 210 is formed from doped regions 184 and 192, a nickel silicide layer 214 is formed from doped region 194A, a nickel silicide layer 216 is formed from doped region 194B, a nickel silicide layer 218 is formed from doped region 186, a nickel silicide layer 220 is formed from gate electrode 140, a nickel silicide layer 222 is formed from gate electrode 142, and a nickel silicide layer 224 is formed from gate electrode 144. The portions of the nickel over field isolation regions 106A-106E, insulating spacers 162, and silicide blocking mask 200 remain unreacted. After formation of the nickel silicide regions, any unreacted nickel is removed. It should be understood that the type of silicide is not a limitation of the present invention. For example, other suitable silicides include titanium silicide (TiSi), platinum silicide (PtSi), cobalt silicide (CoSi$_2$), tungsten silicide, iridium silicide, or the like. As those skilled in the art are aware, silicon is consumed during the formation of silicide and the amount of silicon consumed is a function of the type of silicide being formed.

Still referring to FIG. 19, a layer of dielectric material 230 is formed over silicide layers 206, 208, 210, 214, 216, 218, 220, 222, and 224, over field isolation regions 106A-106B, and over spacers 162. By way of example, dielectric material 230 is oxide. Openings are formed in dielectric layer 230 to expose silicide layers 206, 208, 210, 214, 216, and 218, which openings are filled with an electrically conductive material to form contacts 236, 238, 240, 244, 246, and 248, respectively. It should be noted that contact 248 may be referred to as a substrate electrode or a substrate contact.

By now it should be appreciated that memory cells comprised of three active devices have been provided wherein the three active devices include a capacitor 42 having two terminals, a zero-delay self-aligned tunneling-enhanced capacitor 44 having two terminals, and a state transistor 46 having three terminals. Although only three terminals are shown, those skilled in the art appreciate that a transistor may have a fourth terminal coupled to the body of semiconductor material from which the transistor is manufactured. In accordance with an embodiment, capacitor 42 may be a PMOSFET ("p-channel metal oxide field effect transistor") that includes a body comprising an n-well 120 within semiconductor material 102 that is doped with a p-type impurity material. Semiconductor material 102 may be silicon. N-well 120 may be referred to as an n-well pocket. Doped regions 150 and 180 are formed in n-well 120 and serve as sources of holes, i.e., heavily doped p region or p+ region 180 and lightly doped p region or PLDD region 150 serve as sources of holes. These sources of holes help in forming a p-channel when PMOS capacitor 42 is in an inversion mode. N-well 120 also includes a heavily doped n-type region, i.e., an n+ region, 190 that is used to make a resistive contact to n-well 120. Heavily doped p+ region 180 and heavily doped n+ region 190 may be shorted together by forming a salicide from heavily doped p+ region 180 and heavily doped n+ region 190 or by landing a contact on both heavily doped p+ region 180 and heavily doped n+ region 190 or at the junction of heavily doped p+ region 180 and heavily doped n+ region 190. A gate structure 260 is formed over active area 120, wherein gate structure 260 includes a gate oxide 130A on active area 120, and a p+ polysilicon gate 140 on gate oxide 130A.

Zero-delay self-aligned tunneling-enhanced capacitor 44 may be comprised of a MOSFET device that includes a body comprising an n-well 122 within semiconductor material 102 that is doped with a p-type impurity material. N-well 122 may be referred to as an n-well pocket. A heavily doped n-region or n+ region 192 is formed in n-well 122 to make a resistive contact to n-well 122. Doped regions 184 and 154 are formed in n-well 122 wherein doped region 184 is a heavily doped p region or p+ region and doped region 154 is a lightly doped p region or PLDD region. PLDD region 154 extends within the body of N-well 122, at the silicon surface, and adjacent the polysilicon gate 142. It should be noted that PLDD region 154 is an extended region that is electrically shorted to n-well 122 through heavily doped p+ region 184 and silicide 210. This configuration for Zero-delay self-aligned tunneling-enhanced capacitor 44 inhibits depletion in tunneling-enhanced capacitor 44 which would increase delays during Fowler-Nordheim Tunneling used for erasing the cell.

State transistor 46 may be comprised of a MOSFET having a gate electrode 144 heavily doped with an impurity material of n-type conductivity formed over a bulk semiconductor area which may be a p substrate 102 having doped regions 158 and 160 that are heavily doped with an impurity material of p-type conductivity, wherein doped regions 158 and 160 make a resistive contact to p substrate 102. State transistor 46 may also include a drain 194B comprising an n-type lightly doped drain ("NLDD") 160 and a source 194A comprising an NLDD region 158 and a heavily doped drain region. It should be noted that drain 194A may also include a lightly doped drain. It should be appreciated that an access transistor is absent from semiconductor component 100 because semiconductor component 100 operates without isolating different rows.

Because semiconductor component 100 is configured such that an access transistor is absent, the series resistance introduced by the access transistor is absent thereby precluding the degradation in the transfer function from the stored charge to the cell current. Accordingly semiconductor component 100 has a higher transfer function than that of a memory cell that includes an access transistor which yields a clearer read signal. In addition, eliminating the access transistor reduces the number of terminals.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a non-volatile memory cell, comprising:
    providing a semiconductor material of a first conductivity type having a major surface;
    forming a first isolation region in a first portion of the semiconductor material and a second isolation region in a second portion of the semiconductor material, the first isolation region having first and second sides, the second isolation region having first and second sides, wherein the portion of the semiconductor material adjacent the first side of the first isolation region serves as a first active area, the portion of the semiconductor material between the second side of the first isolation region and the first side of the second isolation region serves as a second active area, the portion of the semiconductor material adjacent the second side of the second isolation region serves as a third active area, and a fourth portion of the semiconductor material serves as a fourth active area;
    forming a first capacitor from the first active area, the first capacitor having first and second electrodes, the first electrode of the first capacitor serving as a control gate;
    forming a tunneling-enhanced device from the second active area, the tunneling-enhanced device having a first electrode and a second electrode, the first electrode of the tunneling-enhanced device serving as an erase gate, and the second electrode of the tunneling-enhanced device coupled to the second electrode of the first capacitor to form a floating gate; wherein forming the first capacitor and the tunneling-enhanced device comprises:
        forming a first doped region of a second conductivity type and a first dopant concentration in the first active area;
        forming a second doped region of the second conductivity type and a second dopant concentration in the second active area;
        forming an insulating layer over the first active area and the second active area;
        forming a first gate conductor over a portion of the insulating layer that is over the first active area and a second gate conductor over a portion of the insulating layer that is over the second active area, the first gate conductor having first and second sidewalls and the second gate conductor having first and second sidewalls;
        forming a third doped region of the first conductivity type in the first doped region and a fourth doped region of the first conductivity type in the second doped region, the third doped region laterally adjacent the first sidewall of the first gate conductor and the fourth doped region laterally adjacent the first sidewall of the second gate conductor;
    forming a state transistor from the third active area, the state transistor having a control electrode, a first current carrying electrode, and a second current carrying electrode, the control electrode of the state transistor directly coupled to the floating gate; and
    forming substrate contact to the fourth active area through which current can flow to the third active area so that the state transistor has a negative threshold voltage.

2. The method of claim 1, further including:
    forming another doped region of the first conductivity type from the fourth active area, wherein the substrate contact contacts the another doped region.

3. The method of claim 1, wherein forming the first capacitor and the tunneling-enhanced device further comprises:
    forming a fifth doped region of the first conductivity type adjacent the third doped region;
    forming a sixth doped region of the first conductivity type adjacent the fourth doped region and laterally between the fourth doped region and the first isolation region;
    forming a seventh doped region of the second conductivity type adjacent the fifth doped region; and
    forming an eighth doped region of the second conductivity type adjacent the sixth doped region and laterally between the sixth doped region and the first isolation region.

4. The method of claim 3, wherein forming the first capacitor and the first tunnel device further comprises:
    forming the first electrode of the first capacitor in contact with the fifth doped region and the seventh doped region; and forming the first electrode of the tunneling-enhanced device in contact with the sixth doped region and the eighth doped region.

5. The method of claim 4, wherein forming the state transistor comprises:
   forming the insulating layer over the third active area;
   forming a third gate conductor over a portion of the insulating layer over the third active area, the third gate electrode having first and second sidewalls; and
   forming a ninth doped region of the second conductivity type in the third active area and a tenth doped region of the second conductivity type in the third active area, the ninth doped region laterally adjacent the first sidewall of the third gate electrode and the tenth doped region between the ninth doped region and the second isolation region.

6. The method of claim 5, further including forming the first current carrying electrode in electrical contact with the ninth doped region and forming the second current carrying electrode in contact with the tenth doped region.

7. The method of claim 6, further including:
   forming an eleventh doped region of the first conductivity type below and in contact with the second isolation region; and
   forming a twelfth doped region of the first conductivity type below and in contact with the first isolation region.

8. The method of claim 7, further including:
   forming first and second spacers adjacent the first and second sidewalls of the first gate electrode, respectively;
   forming first and second spacers adjacent the first and second sidewalls of the second gate electrode, respectively; and
   forming first and second spacers adjacent the first and second sidewalls of the third gate electrode, respectively.

9. The method of claim 8 further including electrically coupling the first gate electrode, the second gate electrode, and the third gate electrode together.

10. A method for manufacturing a non-volatile memory device, comprising:
    providing a semiconductor material of a first conductivity type having a major surface;
    forming a first well region of a second conductivity type in a first portion of the semiconductor material and a second well region of the second conductivity type in a second portion of the semiconductor material, the first well region spaced apart from the second well region by a first isolation structure;
    forming a first capacitor from the first well region of the second conductivity type, the first capacitor having a first electrode and a second electrode, the first electrode of the first capacitor serving as a first control gate of the non-volatile memory device, wherein forming the first capacitor from the first well region comprises:
        forming a first insulating layer over at least the first well region and the second well region;
        forming a first gate conductor over a first portion of the first insulating layer that is over the first well region, the first gate conductor having a first side and a second side;
        forming a first doped region of the first conductivity type in a first portion of the first well region that is adjacent to the first side of the first gate conductor;
        forming a second doped region of the first conductivity type in a second portion of the first well region that is adjacent the second side of the first gate conductor;
    forming a tunneling-enhanced capacitor from the second well region, the tunneling-enhanced capacitor having a first electrode and a second electrode, the first electrode of the tunneling-enhanced capacitor serving as an erase gate of the non-volatile memory device, and the second electrode of the tunneling-enhanced capacitor coupled to the second electrode of the first capacitor to form a first floating gate, wherein forming the tunneling-enhanced capacitor from the second well region comprises:
        forming a second gate conductor over a portion of the first insulating layer that is over the second well region, the second gate conductor having a first side and a second side;
        forming a third doped region of the first conductivity type in a first portion of the second well region that is adjacent to the first side of the second gate conductor;
        forming a fourth doped region of the first conductivity type in a second portion of the second well region that is adjacent the second side of the second gate conductor;
    forming a transistor from a third portion of the semiconductor material, the third portion of the semiconductor material spaced apart from the second well region by a second isolation structure and serving as a third active area, the transistor having a control electrode, a first current carrying electrode, and a second current carrying electrode, the control electrode of the transistor directly coupled to the first floating gate; and
    forming a contact to a fourth portion of the semiconductor material through which current can flow from the contact to the third active area so that the transistor formed from the third active area has a negative threshold voltage.

11. The method of claim 10, further including using one of a shallow trench isolation technique, a local-oxidation-of-silicon technique, or a deep trench isolation technique to form the first isolation structure and the second isolation structure.

12. The method of claim 10, further including forming a first channel stop region extending from the first isolation structure into the semiconductor material and a second channel stop region extending from the second isolation structure into the semiconductor material.

13. The method of claim 10, further including forming the first capacitor by:
    forming a fifth doped region of the second conductivity type in a third portion of the first well region;
    electrically connecting the first electrode to the first doped region of the first capacitor and the fifth doped region of the first capacitor; and
    forming a third electrode electrically contacting the second doped region of the first capacitor.

14. The method of claim 10, further including forming the tunneling-enhanced capacitor by
    forming a fifth doped region of a second conductivity type in a third portion of the second well region that is adjacent the second side of the first isolation structure;
    forming the first electrode to electrically contact the first doped region and the fifth doped region.

15. The method of claim 10, further including forming the transistor by
    forming a third gate conductor over the first insulating layer, the third gate conductor having a first side and a second side;

forming a first doped region of a second conductivity type in a first sub-portion of the third portion of the semiconductor material that is adjacent the first side of the third gate conductor;

forming a second doped region of the second conductivity type in a second sub-portion of the third portion of the semiconductor material that is adjacent the second side of the third gate conductor;

forming the first electrode in electrical contact with the first doped region of the second conductivity type that is adjacent the first side of the third gate conductor; and forming a second electrode in electrical contact with the second doped region of the second conductivity type formed in a second portion of the semiconductor material that is adjacent the second side of the third gate conductor.

16. A method for manufacturing and operating a non-volatile memory device, comprising:

providing a semiconductor material of a first conductivity type having a major surface;

forming a first well region of a second conductivity type in a first portion of the semiconductor material and a second well region of the second conductivity type in a second portion of the semiconductor material, the first well region spaced art from the second well region by a first isolation structure;

forming a first capacitor from the first well region of the second conductivity type, the first capacitor having a first electrode and a second electrode, the first electrode of the first capacitor serving as a first control gate of the non-volatile memory device;

forming a tunneling-enhanced capacitor from the second well region, the tunneling-enhanced capacitor having a first electrode and a second electrode, the first electrode of the tunneling-enhanced capacitor serving as an erase gate of the non-volatile memory device, and the second electrode of the tunneling-enhanced capacitor coupled to the second electrode of the first capacitor to form a first floating gate;

forming a transistor from a third portion of the semiconductor material, the third portion of the semiconductor material spaced art from the second well region by a second isolation structure, the transistor having a control electrode, a first current carrying electrode, and a second current carrying electrode, the control electrode of the transistor directly coupled to the first floating gate;

forming a contact to a fourth portion of the semiconductor material through which current can flow from the contact to the third portion of the semiconductor material and the transistor formed from the third portion of the semiconductor material has a negative threshold voltage;

generating a cell current for one of a read operation, an erase operation, and a programming operation, wherein generating the cell current for read operation includes coupling a first voltage to the first current carrying electrode of the transistor, to the first electrode of the first capacitor, and coupling a second voltage to the second current carrying electrode of the transistor and to the first electrode of the tunneling-enhanced capacitor;

generating the cell current for the erase operation includes coupling the first voltage to the first and second current carrying electrodes of the transistor and to the first electrode of the tunneling-enhanced capacitor, and coupling a third voltage to the first electrode of the first capacitor; and generating the cell current for the programming operation includes coupling the first voltage to the first and second current carrying electrodes of the transistor, and coupling the third voltage to the first electrode of the first capacitor and to the first electrode of the tunneling-enhanced capacitor.

17. The method of claim 16, wherein generating the cell current for one of the read operation, the erase operation, and the programming operation further includes generating the cell current for one of the read operation, the erase operation, the programming operation, or a programming inhibition operation, wherein generating the cell current for the programming inhibition operation includes coupling the third voltage to the first electrode of the first capacitor and to the first electrode of the tunneling-enhanced capacitor, coupling a fourth voltage to the first current carrying electrode of the transistor, configuring the second current carrying electrode of the transistor to be floating.

18. The method of claim 17, wherein the second voltage ranges from 0 volts to 5 volts, and the third voltage ranges from 8 volts 25 volts, and the fourth voltage ranges from 1.8 volts to half of the third voltage.

19. The method of claim 16, wherein the first voltage is a ground potential, the second voltage is a read voltage, and the third voltage is an internal programming voltage.

20. The method of claim 16, further including configuring the voltage at the first floating gate to be positive in an erased state, negative in a programmed state, and zero in a neutral state.

* * * * *